United States Patent [19]

Mathis et al.

[11] Patent Number: 5,032,785
[45] Date of Patent: Jul. 16, 1991

[54] ARRANGEMENT FOR MEASURING AN ELECTRICAL POWER OR ENERGY

[75] Inventors: Halder Mathis, Baar; Theo Frutiger, Steinhausen; Friedrich E. Wagner, Baar, all of Switzerland

[73] Assignee: Landis & Gyr Betriebs AG, Zug, Switzerland

[21] Appl. No.: 498,345

[22] Filed: Mar. 23, 1990

[30] Foreign Application Priority Data

Mar. 31, 1989 [CH] Switzerland ................ 1185/89

[51] Int. Cl.$^5$ .................. G01R 21/06; G01R 11/32
[52] U.S. Cl. .................. 324/107; 324/142; 324/103 R
[58] Field of Search ............ 324/142, 107, 103 R, 324/117 R; 364/483, 487; 328/160; 307/261; 340/653, 660, 657; 332/149, 150

[56] References Cited

U.S. PATENT DOCUMENTS

| | | | |
|---|---|---|---|
| 3,602,843 | 8/1971 | De Vries | 332/9 |
| 4,315,212 | 2/1982 | Gamoh | 324/142 |
| 4,356,446 | 10/1982 | Battocletti | 324/142 |
| 4,378,524 | 3/1983 | Steinmuller | 324/107 |
| 4,408,283 | 10/1983 | Kovalchik et al. | 328/160 |
| 4,434,400 | 2/1984 | Halder et al. | 324/110 |
| 4,456,878 | 6/1984 | Gamoh | 324/142 |
| 4,463,311 | 7/1984 | Kobayashi | 324/142 |
| 4,475,081 | 10/1984 | Kobayashi | 324/107 |

FOREIGN PATENT DOCUMENTS 0335511 10/1989 European Pat. Off.

*Primary Examiner*—Gerard R. Strecker
*Assistant Examiner*—Vinh P. Nguyen
*Attorney, Agent, or Firm*—Marmorek, Guttman & Rubenstein

[57] ABSTRACT

In an arrangement for measuring an electrical power or energy, for each of a plurality of phases, the arrangement includes a voltage input in a transformer supplied with current and connected to an integrator with a high ohm input. Each transformer is connected via an integrator with a high ohm input to a mark-space-amplitude modulator, one of which is provided per phase. Each voltage input is also in communication with the corresponding mark-space-amplitude modulator. Each mark-space-amplitude modulator comprises a mark-space modulator and a pulse amplitude modulator. Each pulse amplitude modulator is provided with two push-pull outputs, each of which is connected to an input of a current/frequency converter for the integration of marks (pulses) and spaces (i.e. spaces between pulses) present at the output of the pulse amplitude modulator. The current/frequency converter is connected to processing and display circuitry for displaying an output.

15 Claims, 7 Drawing Sheets

ARRANGEMENT FOR MEASURING AN ELECTRICAL POWER OR ENERGY

FIELD OF THE INVENTION

The instant invention relates to an arrangement to measure an electric power or energy.

BACKGROUND OF THE INVENTION

An arrangement for measuring an electric output such as an electric energy or power is disclosed in U.S. Pat. No. 3,602,843, in which a mark-space-amplitude modulator is used, the design and operation of which is thoroughly described in that patent.

The present invention has as its object to improve the known arrangement economically by using commercially available assembly elements and to optimize it, with all of the semiconductor elements being contained in an integrated circuit, in particular in an integrated circuit made to the specifications of the user.

SUMMARY OF THE INVENTION

The present invention is an arrangement for measuring an electrical power or energy in a multiphase network. For each phase, the arrangement comprises a voltage input and a transformer supplied with current. Each transformer is connected via an integrator with a high ohm input to a mark-space-amplitude modulator, one of which is provided per phase. Each voltage input is also in communication with a corresponding mark-space-amplitude modulator. Each mark-space-amplitude modulator comprises a mark-space modulator and a pulse amplitude modulator. Each pulse amplitude modulator is provided with two push-pull outputS, each of which is connected to an input of a current/frequency converter for the integration of marks (pulses) and spaces (i.e. spaces between pulses) present at the output of the pulse amplitude modulator. The current/frequency converter is connected to processing and display circuitry for displaying an output.

BRIEF DESCRIPTION OF THE DRAWING

Identical reference numbers designate the same parts in all the figures of the drawing.

DETAILED DESCRIPTION OF THE INVENTION

Figure 1:
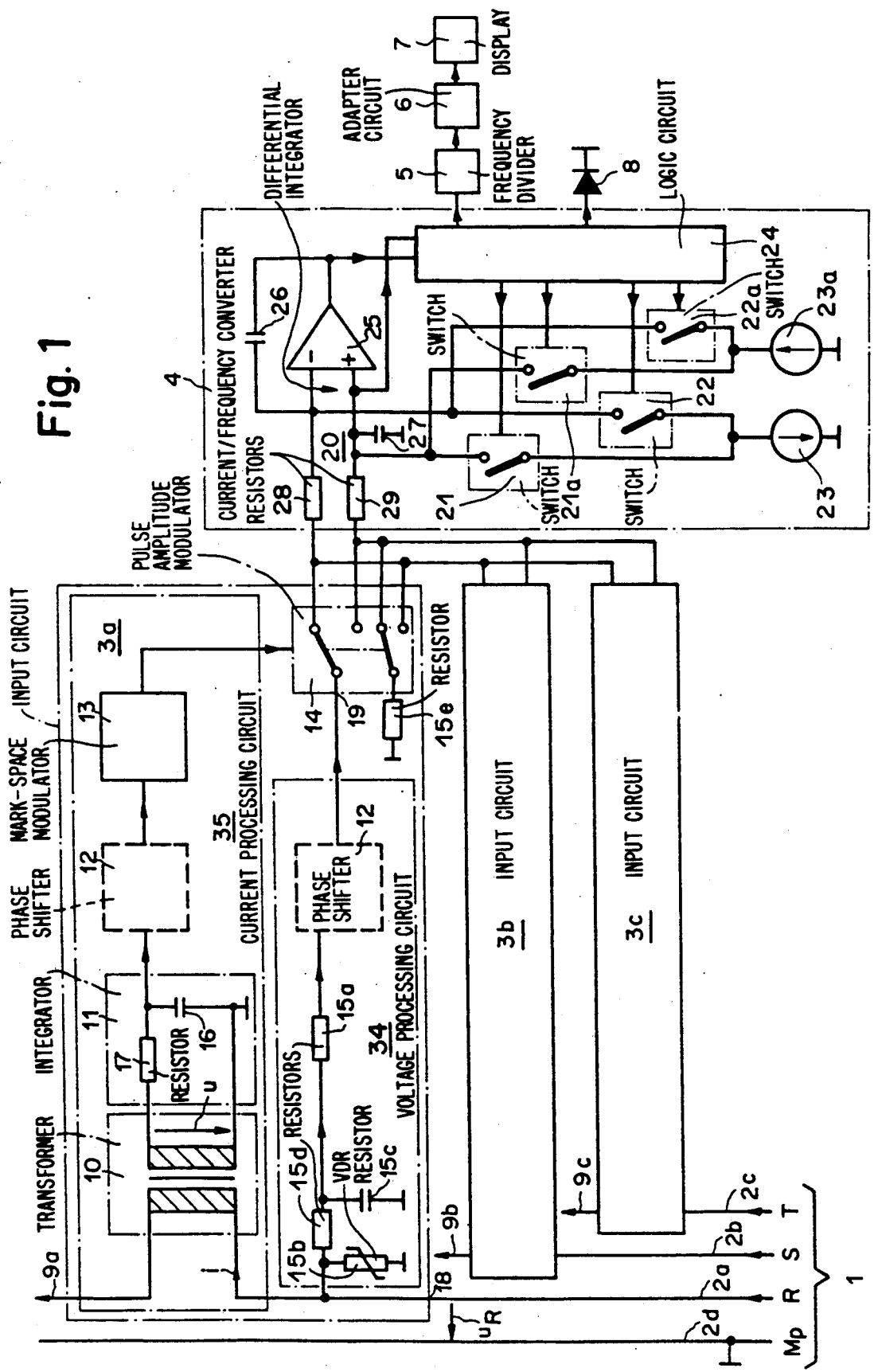
FIG. 1 shows a block diagram of a first embodiment of an arrangement in accordance with the invention.

The arrangement shown in FIG. 1 is a three-phase electricity meter and is supplied by an electric energy supply network 1 via three conductors 2a, 2b and 2c with three phases R, S and T of a three-phase voltage and via a fourth conductor 2d with a ground potential Mp. One input circuit 3a, 3b and 3c is provided for each phase, all three circuits being designed in the same manner and their outputs being connected to a common current/frequency converter 4. A first output of the current/frequency converter 4 is connected to a series circuit 5;6;7 which comprises a frequency divider 5, an adapter circuit 6 and a display 7, in the sequence as indicated. A light emitting diode 8 is optionally provided, its anode being connected to a second output of the current/frequency converter 4, while its cathode is grounded. With a sufficiently low frequency of the associated output signal of the current/frequency converter 4, the light emitting diode 8 can also be replaced by a relay. In that case the optical output of the light emitting diode 8 is replaced by an electro-mechanical relay contact output. The adapter circuit 6 may comprise, for example, a stepping motor with its interface circuit. In that case the display 7 preferably comprises a mechanical pulse counter. Of course the display 7 can also be formed from light emitting diodes or liquid crystals. The current/frequency converter 4, the frequency divider 5, the adapter circuit 6, the display 7 and the light emitting diode 8 together constitute a display device 4;5;6;7;8 at the output of the electricity meter.

Each of the conductors 2a, 2b and 2c is connected in its corresponding input circuit 3a, 3b and 3c to a pole of a primary winding, the other pole of which is connected to one of the conductors 9a, 9b, and 9c which leaves the corresponding input circuit 3a, 3b and 3c and thereby the electricity meter in order to supply a corresponding load which is not shown here. The primary winding is part of a transformer 10 supplied with current, one of which is provided per phase, and which is furthermore equipped with a secondary winding and with a ferromagnetic core.

In order to simplify the drawing, FIG. 1 shows only the contents of one of the three input circuits, i.e. those of input circuit 3a.

The energy supply network 1 can also be single-phased. In that case the conductors 2b, 2c, 9b and 9c as well as the input circuits 3b and 3c are not present and the electricity meter is a single-phase electricity meter.

Each input circuit 3a, 3b and 3c comprises the transformer 10, an integrator 11 with a high-ohm input, an optional phase shifter 12, a mark-space modulator 13, a pulse amplitude modulator 14, a resistor 15a, a voltage-dependent VDR resistor 15b, a resistor 15d, a resistor 15e and a capacitor 15c. The mark-space modulator 13 and the downstream pulse amplitude modulator 14 constitute together a mark-space-amplitude modulator 13;14, whereby the output of the mark-space modulator 13 is connected to a control input of the pulse amplitude modulator 14, which comprises preferably of a two-pole, two-position polarity reversing switch. The control input of the polarity reversing switch is then the control input of the pulse amplitude modulator 14.

The integrator 11 is installed downstream of the transformer 10, i.e. the two output poles of the transformer 10 are connected to the two input poles of the integrator 11. The latter is preferably an RC low-pass filter and in that case comprises a capacitor 16 and at least one resistor 17 which together constitute an RC unit 16;17. The common pole of the capacitor 16 and of the resistor 17 constitutes a single-pole output of the integrator 11 while the other pole of the resistor 17 constitutes a first input pole of the integrator 11 and the other pole of the capacitor 16, which is grounded, constitutes a second input pole of the integrator 11.

Figure 2:
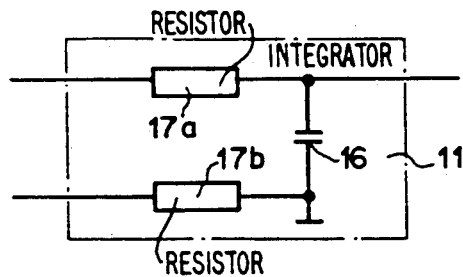
FIG. 2 shows a circuit diagram of an integrator.

The RC low-pass filter can however also be designed as shown in FIG. 2, where two resistors 17a and 17b are used, each of which is located between one of the two input poles of the integrator 11 and one of the two poles of the capacitor 16, whereby one pole of the capacitor 16 is grounded and the other pole constitutes the output of the integrator 11. Since the two output poles of the transformer 10 are connected to the two input poles of the integrator 11 (see FIG. 1), the two resistors 17a and 17b are also arranged in series in relation to each one of the output poles of the transformer 10. The sum of the resistance value of the two resistors 17a and 17b of FIG. 2 are selected so as to be equal to the value of the resistor 17 of FIG. 1.

The single-pole output of the integrator 11 is connected directly or indirectly to an input of the mark-space modulator 13 which is at the same time a first input of the mark-space-amplitude modulator 13;14.

If the optional phase shifter 12 is used, then it is located either between the integrator 11 and the first input of the mark-space-amplitude modulator 13;14 or it is installed in the electricity meter downstream of a voltage input 18, which is then connected via the phase shifter 12 to an amplitude input 19 of the pulse amplitude modulator 14. This amplitude input 19 is at the same time a second input, i.e. the amplitude input of the mark-space-amplitude modulator 13;14. The resistor 15a is installed directly upstream of the amplitude input 19 in the first case, and directly upstream of the phase shifter 12 in the second case.

The transformer 10, of which there is one per phase, and the voltage input 18 of which there is also one per phase are thus both connected to the corresponding, downstream mark-space-amplitude modulator 13;14, of which there is also one per phase.

Within each of the input circuits 3a, 3b or 3c, between the voltage input 18 and ground lies the voltage-dependent VDR resistor 15b and a circuit 15d;15c which are connected in parallel and which protect the voltage input 18 against excessive voltages and surge voltages of the energy supply network 1. The circuit 15d;15c comprises in the sequence indicated of the resistor 15d and the capacitor 15c, whereby their common connecting point is connected directly or indirectly via resistor 15a to the amplitude input 19 of the pulse amplitude modulator 14.

The polarity-reversing switch contained in the pulse amplitude modulator 14, synchronously with a pulse appearing at its control input, alternately switches the amplitude input 19 of the pulse amplitude modulator 14 and a pole of the resistor 15e to one of the two push-pull outputs of the pulse amplitude modulator 14 which are at the same time two outputs of the mark-space-amplitude modulator 13;14. As used herein the term two push pull outputs refers to two outputs which work in phase opposition, i.e. when two outputs operate in a push pull mode, one output has the value "logic 1" and the other output has the value "logic 0". The second pole of the resistor 15e is grounded. The two outputs of the pulse amplitude modulator 14 are each connected to one of two inputs of a differential integrator 20 which is contained in the current/frequency converter 4.

The current/frequency converter 4 comprises the differential integrator 20, four single-pole switches 21, 21a, 22 and 22a, current sources 23 and 23a and a logic circuit 24. The logic circuit 24 is illustrated in FIG. 9 and described in detail below. As shown in FIGS. 1, 6, 7, 8 and 9, the circuit 24 interfaces the elements 5, 6, 7, and 8 of FIGS. 1, 6, 7, and 8 and controls the switches 21, 21a, 22, and 22a of FIGS. 1, 6, 7, and 8. The differential integrator 20 in turn comprises an operational amplifier 25, two capacitors 26 and 27 and two resistors 28 and 29. In FIG. 1, the switches 21, 21a, 22 and 22a are represented as single-pole on/off switches in order to simplify the drawing, to indicate their main functioning, i.e. switching the current sources 23 and 23a on/off. A person skilled in the art knows however that in practice the current of a current source cannot simply be switched off as in a voltage source, but that the current source must be short-circuited simultaneously, directly or indirectly. For that reason each of the switches 21, 21a, 22, and 22a comprises a single-pole switch whose normally open contact assumes the role of the on/off switch, while its normally closed contact short-circuits the corresponding current source 23 or 23a.

A first pole of each of the two resistors 28 and 29 constitutes one of the two inputs of the differential integrator 20. These poles constitute at the same time the two inputs of the current/frequency converter 4. Each of these two inputs of the differential integrator 20 are connected via resistor 28 or 29 to the inverting or to the non-inverting input of the operational amplifier 25 whose output is a first output of the differential integrator 20, while the non-inverting input of the operational amplifier 25 constitutes a second output of the integrator 20. The capacitor 26 is installed between the output of the operational amplifier 25 and its inverting input, while the capacitor 2 is located between the non-inverting input of the operational amplifier 25 and ground.

The first output of the differential integrator 20 is connected to a first input and its second output to a second input of the logic circuit 24 whose two signal outputs constitute the two outputs of the current/frequency converter 4. Four control outputs of the logic circuit 24 are connected to one control input of each of the four switches 21, 22, 21a or 22a, whereby the first two switches 21 and 22 connect a pole of the current source 23 and the latter two switches 21a and 22a connect a pole of the current source 23a to the non-inverting or to the inverting input of the operational amplifier 25. The other pole of each of the two current sources 23 and 23a is grounded. The two current sources 23 and 23a are of opposite polarity and each serves to discharge the capacitor 27 or 26, depending on the current direction of the input signals of the differential integrator 20.

It is the task of circuit 21;22;21a;22a;23;23a;24 to convert the integrated voltages at the outputs of the differential integrator 20 into proportional quantities of pulses per time unit, whereby each pulse represents a constant quantity of energy. To prevent the output voltage of the differential integrator 20 from increasing in time to infinity, the pulse production is such that when a certain energy quantity is reached, a corresponding charge quantity is subtracted in each instance by means of the current source 23 or 23a and the switch 21 and 22 or 21a and 22a from the charge contents of the capacitor 27 or 26 while at the same time a pulse is produced at least one of the outputs of the current/frequency converter 4. The frequency of these pulses is here proportional to the value of the integrals of the two input voltages of the differential integrator 20.

Figure 3:
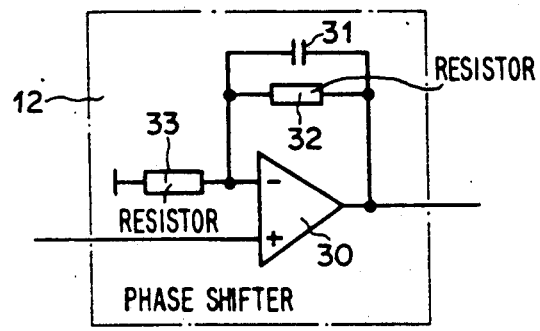
FIG. 3 shows a circuit diagram of a first embodiment of an active phase shifter.
Figure 4:
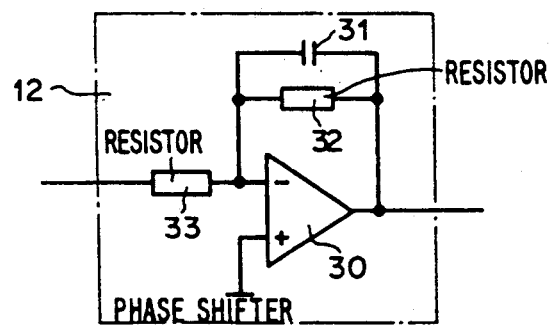
FIG. 4 shows a circuit diagram of a second embodiment of an active phase shifter.
Figure 5:
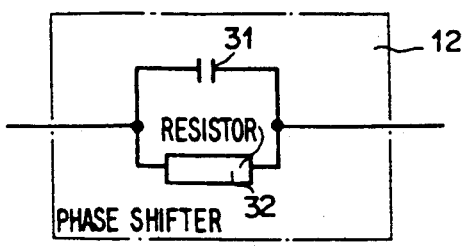
FIG. 5 shows a circuit diagram of a passive phase shifter.

The phase shifter 12 is preferably of one of the three designs shown in FIGS. 3 to 5.

The phase shifter 12 shown in FIG. 3 comprises of a non-inverting amplifier assembled by means of an operational amplifier 30, whereby a capacitor 31 is connected in parallel to a resistor 32 in the feedback path of the non-inverting amplifier between the output and the inverting input of the operational amplifier 30. The inverting input of the operational amplifier 30 is in addition grounded via a resistor 33, while the non-inverting input and the output of the operational amplifier 30 constitute the input and the output of the phase shifter 12, respectively.

The phase shifter 12 shown in FIG. 4 comprises an amplifier, this time inverting, which is also assembled by means of the operational amplifier 30, into whose feedback path between the output and the inverting input of the operational amplifier 30 the capacitor 31 is again connected parallel to the resistor 32. The non-inverting input of the operational amplifier 30 is this time grounded, while the inverting input is connected via resistor 33 to the input of the phase shifter 12. The output of the operational amplifier 30 constitutes the output of the phase shifter 12.

The passive phase shifter 12 shown in FIG. 5 comprises only of the capacitor 3 which is connected parallel to the resistor 32. It is preferably used between the voltage input 18 of the electricity meter and the pulse amplitude modulator 14, since the voltage input 18 is a strong-signal input which is directly connected to the energy supply network 1 and thus does not require any amplification. The active phase shifters 12 shown in FIGS. 3 and 4 on the other hand, are preferably used between the integrator 11 and the mark-space modulator 13, since a signal which is attenuated by the integrator 11 requires amplification.

The secondary winding of the transformer 10 is only insignificantly loaded by the integrator 11: the transformer 10 thus runs practically in no-load operation and practically consumes no secondary current. The transformer 10 which is supplied with current and runs in nearly no-load operation on the secondary side measures the derivative di/dt of a corresponding network current i which flows in the conductor 2a, 2b or 2c.

The current i which is to be measured by the electricity meter flows through the primary winding of the transformer 10 and induces a voltage u, proportional to di/dt, in its secondary winding. This voltage u is integrated by the RC unit of the integrator 11 so that its output voltage is proportional to the current i to be measured.

The integrator 11 which comprises only of passive components is not an ideal integrator, i.e. residual errors occur during integration in the phase, and these must be corrected by the phase shifter 12 for 50 Hz (Europe) or 60 Hz (USA). Because of the non-ideal integration the other frequencies are somewhat distorted in phase and amplitude. The undesirable phase shifts and attenuations caused by the integrator 11 are reversed or compensated by means of the capacitor 31 of the phase shifter 12 or of the amplification factor of the feedback operational amplifier 30. The circuit is to be adapted in such manner that it supplies input signals to the inputs of the mark-space-amplitude modulator 13;14 at 50 Hz (Europe) or at 60 Hz (USA) which is correct in phase and amplitude and so that the errors in frequency remain within admissible tolerances.

If the phase shifter 12 is located between the voltage input 18 and the amplitude input 19 of the pulse amplitude modulator 14, it must be adjusted so that voltage signal $u_R$ to be measured by the electricity meter is shifted in phase by the same value as the output voltage of the integrator 11 is shifted in phase.

The capacitor 31 of the phase shifter 12 can also serve to achieve a phase adjustment of the entire electricity meter to measure reactive (i.e. apparent) energy for example, where it is known that an additional phase shift of 90° must occur.

The RC unit of the integrator 11 which is assembled only with passive components has the advantage that Dirac surge voltages, which are produced through the derivative di/dt, for example, in case of phase controls, can easily be processed by the passive RC unit without causing any interferences, and the advantage that with phase controls no difficulties are created with DC components, harmonic waves, or high-frequency noise signals which take effect only after having been strongly attenuated, the advantage that the capacitor 16 can be installed so that the downstream circuit 12 or 13 is unaffected by d.c. current, that no offset-voltage occurs which could be integrated and could then drive the integrator output into saturation.

The greater the time constant selected for the integrator 11, the better is the integration achieved by the integrator 11 and the less corrections by means of the capacitor 31 are necessary. However, the amplification of the feedback coupled operational amplifier 30 must then be the greater.

Since the value of the wire resistance of the secondary winding of the transformer 10 must be included in the value of the resistor 17 or in the values of the resistors 17a and 17b, it must be selected relatively small and must be compensated for temperature variation by means of an NTC resistor (negative temperature coefficient resistor). Another possibility is to make the secondary winding of manganin.

The ferromagnetic core of the transformer 10 is preferably provided with a magnetic discontinuity. If the magnetic discontinuity is of appropriate size, it cannot then be driven into saturation by the d.c. current components of the current i to be measured, and thus cannot distort the measuring results.

The core of the transformer 10 is preferably a ferrite head core provided with a magnetic discontinuity. Ferrite head cores are obtainable commercially and need not be specially manufactured. Instead of ferrite head cores with magnetic discontinuity, it is also possible to use some other core configuration which amplifies the magnetic field produced by the current i, keeps away external magnetic fields and can be equipped with a coil that is simple to wind. With this it would be especially economical to use an E-core of sheet metal lamina, whereby the magnetic discontinuity could be made in form of a ceramic element for example and can be used as a stop when piling up the metal sheets of the laminated core of the transformer.

However, the transformer 10 can also be a so-called active current transformer such as is described in the EP 0 335 511 Al (corresponds to the British patent application No. 8 805 245 and to the U.S. patent application No. 318 796) for example. The contents of these patent documents are incorporated herein by reference. In that case the transformer 10 has yet a third winding as a feedback coupling winding which is connected with an input of an amplifier which in turn supplies the secondary winding of the transformer 10. The ferromagnetic core of the transformer 10 comprises in that case of two magnetic circuits which have a common magnetic path which is surrounded at least by the third winding. The secondary winding surrounds either this common magnetic path or it surrounds the non-common magnetic path of one of the two magnetic circuits while the other magnetic circuit is surrounded by the primary winding. The primary winding has preferably only half a turn here, and has the configuration of a hair-pin curve. The amplifier functions as a variable gain amplifier and regulates the overall magnetic flux in the common magnetic path of the two magnetic circuits to zero. The core of the transformer 10 preferably comprises in this case a ferrite housing and an adjustable ferrite core to adjust the magnetic discontinuity. The latter is filled with air or at least partly with a non-ferromagnetic material such as alumina, for example.

The mark-space modulator 13 converts the output signal of the integrator 11, or of the phase shifter 12, which is proportional to the current i to be measured into pulses whose mark-to-space ratio is proportional to the current i. These pulses are amplitude-modulated in the pulse amplitude modulator 14 so that the marks and spaces appear at its output whose algebraic summation levels are proportional to the product $u_R i$ 1, that is proportional to the measured power. The mark-space-amplitude modulator 13;14 thus works as a multiplier. In order to obtain the power value, the levels of the marks and the spaces are integrated in the RC units 26;28 and 27;29 of the downstream differential integrator. The differential integrator provides at the same time the difference between the two levels and thereby forms the algebraic sum which gives the measured energy, since the integration is continuous in time. The circuit 21, 22, 23, 24 finally converts the calculated value of the measured energy to pulses whose frequency is proportional to the value of this energy.

Since the voltage $u_R$ of the energy supply network is fed directly through resistor 15a to the pulse amplitude modulator 14 or to the phase shifter 12, good current impression into the integrator is achieved.

In the first embodiment shown in FIG. 1 the three phases of a three-phase electricity meter are added at the input of the current/frequency converter 4 by addition of the three output currents of the input circuits 3a, 3b and 3c.

In FIG. 1 the components 15a, 15b, 15c and, if necessary 12 constitute a voltage processing circuit 34 and the components 10, 11 and if necessary 12 and 13 constitute a current processing circuit 35.

Figure 6:
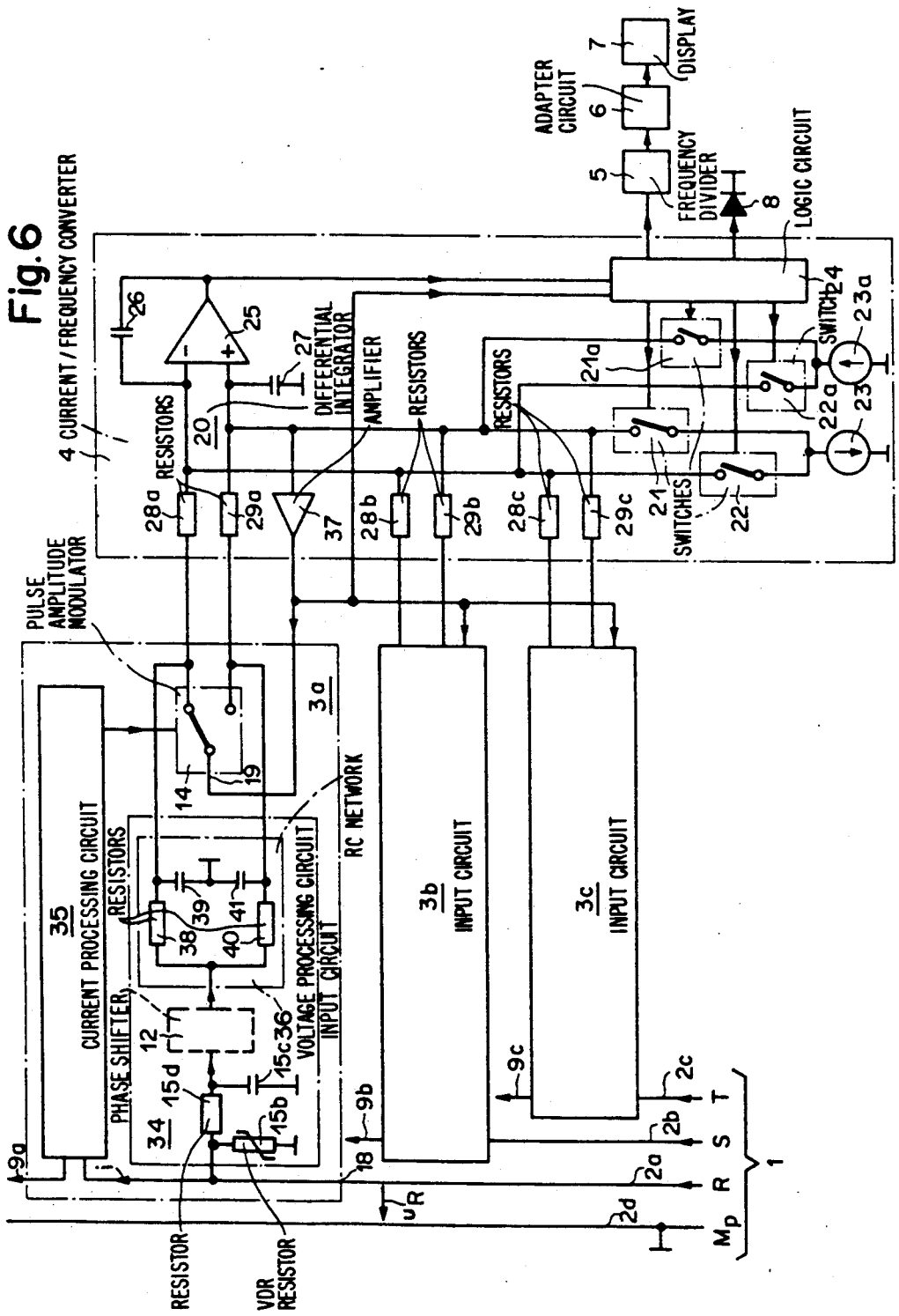
FIG. 6 shows a block diagram of a second embodiment of an arrangement according to the invention.

FIG. 6 shows a second embodiment of the arrangement according to the invention, again comprising a three-phase meter constructed similarly to that of the first embodiment, with the difference that the elements of the voltage processing circuit 34 are different and that the current/frequency converter 4 is slightly changed. The differential integrator 20 is provided here with a pair of resistors 28a;29a or 28b;29b or 28c;29c per phase instead of with one single pair of resistors 28;29. The first pole of the resistors 28a;29a or 28b;29b or 28c;29c is connected to the two outputs of the pulse amplitude modulator 14 belonging to the corresponding phase while a second pole of a resistor 28a or 28b or 28c is connected to an inverting input and a second pole of a resistor 29a or 29b or 29c is connected to a non-inverting input of the operational amplifier 25 of the differential integrator 20. Each voltage input 18 of the electricity meter, one of which is provided per phase, is connected via an RC network 36 to the two outputs of the pulse amplitude modulator 14. The non-inverting input of the operational amplifier 25 is connected via an amplifier 37 which has an amplification factor of one and the output of which is the second output of the differential integrator 20 to an input of all the pulse amplitude modulators 14 as well as to the first input of the logic circuit 24 which is thus not directly, as shown in FIG. 1, connected to the non-inverting input of the operational amplifier 25. The output of the operational amplifier 25 is connected to the second input of the logic circuit 24.

The voltage processing circuit 34 of the second embodiment (see FIG. 6) comprises the voltage-dependent VDR resistor 15b, the resistor 15d, the capacitor 15c, if necessary, the phase shifter 12, and the network 36 which comprises in turn two resistors 38 and 40 and of two capacitors 39 and 41.

The two outputs of the pulse amplitude modulator 14 again constitute the two push-pull outputs of the space-mark-amplitude modulator 13;14 and thereby of the corresponding input circuit 3a, 3b or 3c. However these two outputs are this time connected separately per input circuit 3a, 3b and 3c to one of two inputs of the differential integrator 20 which has this time two such inputs per input circuit 3a, 3b and 3c, that is to say six inputs in all. The capacitor 15c, the voltage-dependent VDR resistor 15b, the resistor 15d and, if present, the phase shifter 12 are connected in the identical manner as in the first embodiment.

The one-per-phase voltage input 18 of the electricity meter can be connected via phase shifter 12 to the input of the associated RC network 36 which is constituted by the interconnected first poles of the resistors 38 and 40, while first poles of the capacitors 39 and 41 are grounded. The second pole of the resistor 38 and of the capacitor 39 are connected to each other and constitute a first output of the RC network 36, of the voltage processing circuit 34 and thereby of the corresponding input circuit 3a, 3b or 3c, since this output is connected to one of the two outputs of the associated pulse amplitude modulator 14. The second pole of the resistor 40 and of the capacitor 41 are also connected to each other and constitute a second output of the RC network 36, of the voltage processing circuit 34 and thereby of the associated input circuit 3a, 3b or 3c, since this output is also connected to one of the two outputs of the corresponding pulse amplitude modulator 14.

The first outputs of the three input circuits 3a, 3b and 3c are not connected directly to each other, as in the first embodiment, but via the resistors 28a, 28b and 28c, while the second outputs of the three input circuits 3a, 3b and 3c are also not directly connected to each other, but via the resistors 29a, 29b and 29c.

Each input circuit 3a, 3b and 3c is provided with an amplitude input which is connected to the amplitude input 19 of the corresponding pulse amplitude modulator 14 within the corresponding input circuit 3a, 3b or 3c. The single-pole switch of the pulse amplitude modulator 14 switches the amplitude input 19 of the pulse amplitude modulator 14 alternately to one of the two outputs of the mark-space-amplitude modulator 13;14, synchronously with its control pulses. The amplitude inputs of the three input circuits 3a, 3b and 3c are connected to each other.

Each of the units 38, 39 and 40, 41 represents a low-pass filter which eliminates noise signals that may be present at the voltage input 18 of the electricity counter. The resistance values of the resistors 38 and 40 must be selected one order of magnitude larger than those of the resistors 28a, 28b, 28c, 29a, 29b and 29c which may each have a resistance value of 100 kohm, for instance. In that case the value of the resistors 38 and 40 are preferably 1 Mohm each, and each of these resistors, together with the voltage $u_R$ of the energy supply network 1 then represents a current source supplying the downstream differential integrator 20 with an input current which charges its capacitor 26 or 27 and is integrated by same.

Since the two inputs of the operational amplifier 25 have nearly the same voltage, these two inputs, as well as the amplitude input 19 of the impulse amplitude modulator 14 because of the presence of the amplifier 37, have the same voltage. As a result there is no voltage drop via one or the other of the two resistor groups 28a;28b;28c or 29a;29b;29c in either of the two positions of the switch of the pulse amplitude modulator 14, and ideally no current can therefore flow in these resistor groups. In either of the two positions of the switch one of the two current sources $u_R$;38 or $u_R$;40 thus supplies one of the two capacitors 26 or 27 while no current reaches the other capacitor 27 or 26. Here the two current sources $u_R$;38 or $u_R$;40 and the two capacitors 26 and 27 exchange roles at each change of position of the switch.

Figure 7:
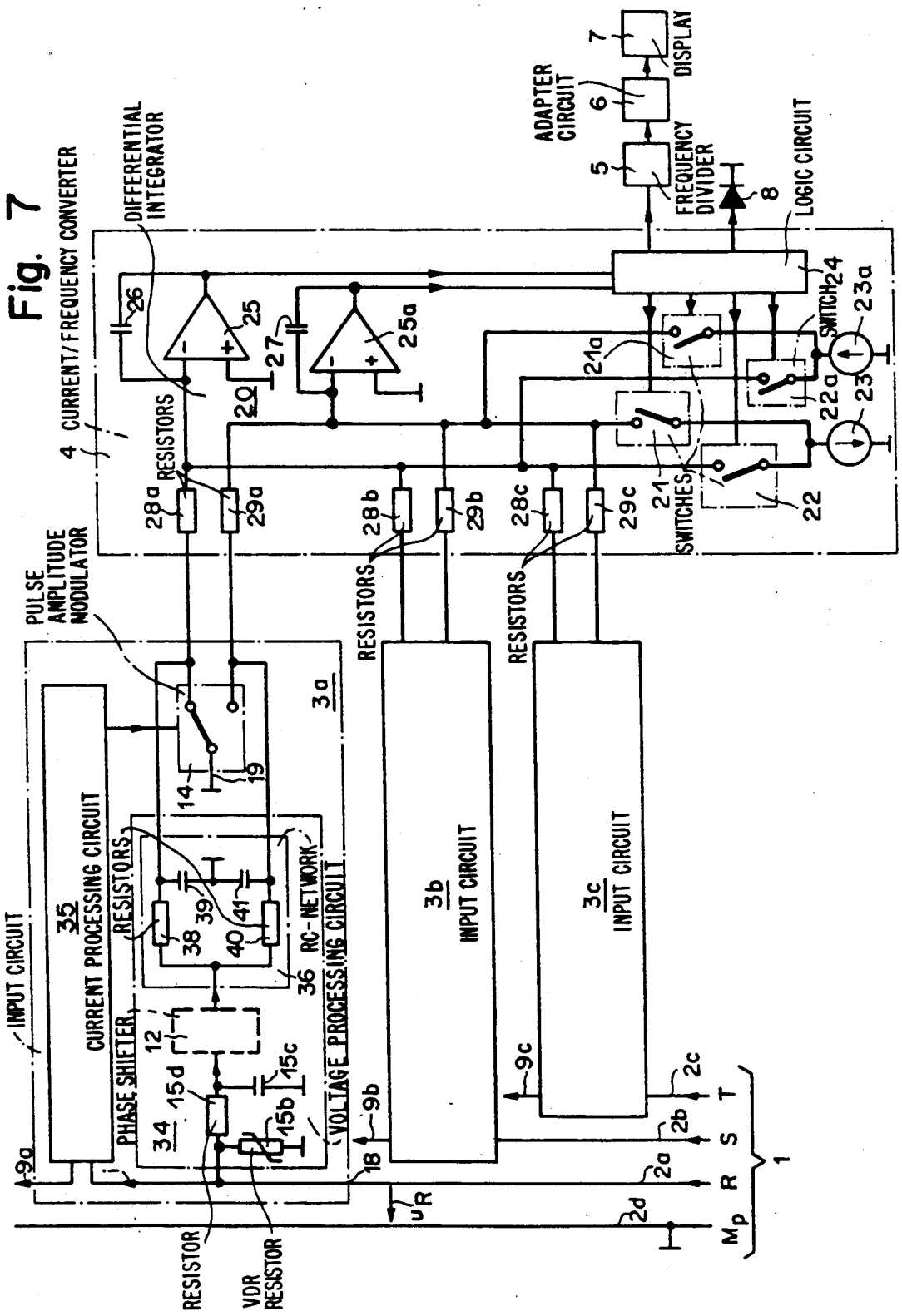
FIG. 7 shows a block diagram of a third embodiment of an arrangement according to the invention.

The third embodiment of the arrangement according to the invention shown in FIG. 7 is assembled similarly to the second embodiment shown in FIG. 6, but with the following differences:

The amplifier 37 with its connection is omitted.

The amplitude input 19 of all the pulse amplitude modulators 14 is grounded.

The non-inverting input of the operational amplifier 25 is grounded without intervening capacitor 27 while the operational amplifier 25 and the capacitor 26 are part of a first Miller integrator 28a;28b;28c;25;26.

The second pole of the resistors 29a, 29b and 29c is no longer connected to the non-inverting input of the operational amplifier 25 but to the inverting input of a further operational amplifier 25a, with the capacitor 27 provided this time between its output and its inverting input. The output of the operational amplifier 25a leads directly to the first input of the logic circuit 24 while the non-inverting input of the operational amplifier 25a is grounded. The operational amplifier 25a and the capacitor 27 are part of a second Miller integrator 29a;29b;29c;-25a;27.

The outputs of the two operational amplifier 25 and 25a constitute the outputs of the two Miller Integrators 28a;28b;28c;25; 26 and 29a;29b;29c;25a;27 and thereby the two outputs of the arrangement to integrate the marks (i.e. pulses) and spaces. The differential integrator 20 in which the marks and the spaces that are present at the output of the pulse amplitude modulator 14 are integrated by means of the RC units 26, 28 and 27, 29 in the first embodiment (FIG. 1) and by means of the RC units 26, 28a, 28b, 28c and 27;29a;29b;29c in the second embodiment (FIG. 6) is replaced in the third embodiment (FIG. 7) by the two Miller integrators 28a;28b;28c;25;26 and 29a;29b;29c;25a;27 which together also constitute an arrangement, contained in the current/frequency converter 4, for the integration of marks and spaces. In this case the marks are integrated by the one, and the spaces by the other of the two Miller integrators 28a;28b;28c;25;26 and 29a;29b;29c;25a;27.

Figure 8:
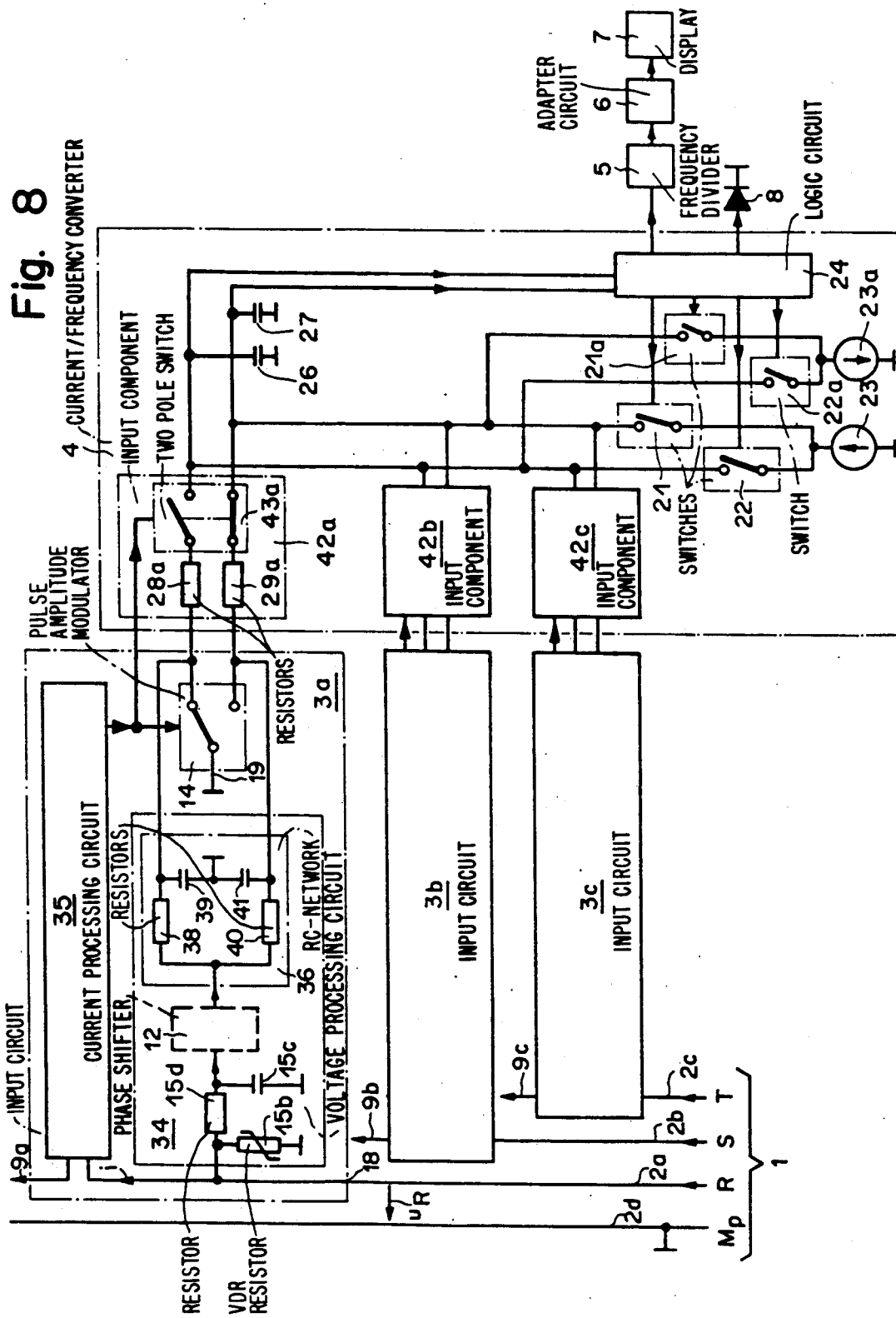
FIG. 8 shows a block diagram of a fourth embodiment of an arrangement according to the invention.
Figure 9:
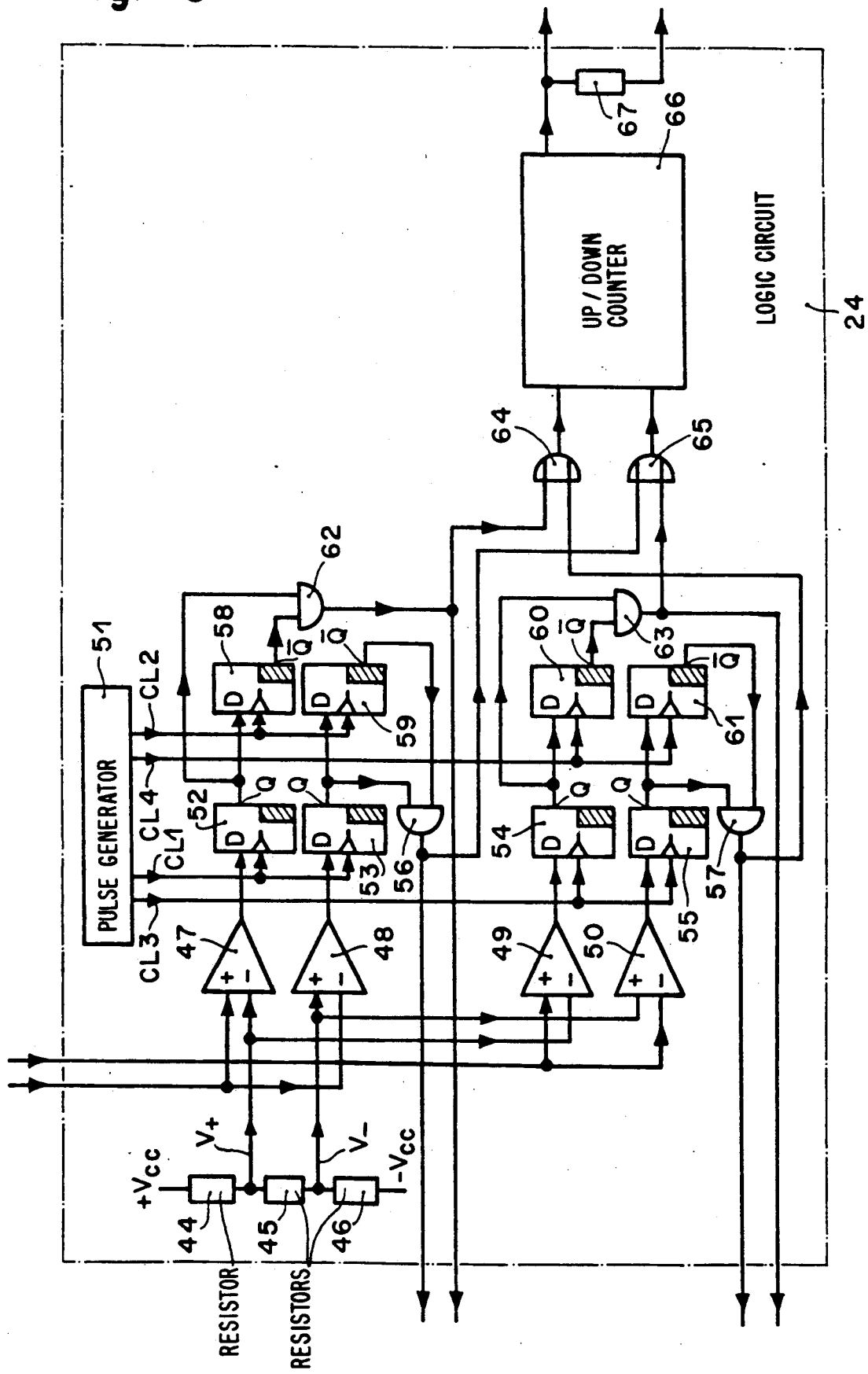
FIG. 9 shows a diagram of a logic circuit.

The fourth embodiment of the arrangement according to the invention shown in FIG. 8 is assembled similarly to the third embodiment shown in FIG. 7, with the following differences:

The operational amplifiers 25 and 25a are omitted.

The first two poles of the two capacitors 26 and 27 are grounded and the second two poles of the capacitors 26 and 27 constitute the two outputs of the arrangement for the integration of the marks and spaces. The second pole of the capacitor 26 is connected to the second input of the logic circuit 24 and the second pole of the capacitor 27 to the first input of the logic circuit 24.

The second pole of the resistor 28a is connected via a first switching contact of a two-pole switch 43a to the second pole of the capacitor 26, while the second pole of the resistor 29 is connected via a second switching contact of the two-pole switch 43a to the second pole of the capacitor 27. The two-pole switch 43, together with its two switching contacts and the resistors 28a and 29a constitute an input component 42a, associated with the input circuit 3a, of the current/frequency transformer 4.

An input component 42b or 42c of the current/frequency converter 4 is also associated with each of the input circuits 3b and 3c, whereby the assembly (not shown) of the input components 42b and 42c is identical to that of the input component 42a, in which a two-pole switch 43b or 43c (not shown)is provided instead of the two-pole switch 43a and which contains the resistors 28b and 29b or 28c and 29c instead of the resistors 28a and 29a, and whereby the two-pole outputs of the input components 42b and 42c are connected in parallel.

The control input of the pulse amplitude modulator 14 of the input circuit 3a is connected to the control input of the two-pole switch 43a, that of the input circuit 3b to that of the two-pole switch 43b and that of the input circuit 3c to that of the two-pole switch 43c.

Since the two-pole switches 43a, 43b and 43c are reversed at the same time as the switch of the corresponding pulse amplitude modulator 14, the switch 43a, 43b or 43c can also be combined with the switch of the corresponding pulse amplitude modulator 14 into one single switch, in that case with at least three poles. In addition to the switch of the pulse amplitude modulator 14, at least two switching contacts per phase are present in that case.

The fourth embodiment shown in FIG. 8 functions similarly to the third embodiment shown in FIG. 7, with the difference that the two Miller integrators 28a;28b;28c;25;26 and 29a;29b;29c;25a;27 are each replaced by an RC integrator 28a;28b;28c;26 or 29a;29b;29c;27.

The two-pole switches 43a, 43b and 43c prevent the capacitors 26 and 27 from discharging through their resistors 28a, 29a, 28b, 29b, 28c or 29c when the first poles of these resistors are grounded by the switch of the corresponding pulse amplitude modulator. For this purpose one of the two switching contacts of the two-pole switch 43a, 43b and 43c is a normally open contact and the other a normally closed contact. As shown in FIG. 8 the first switching contact of the two-pole switch 43a is a normally open contact since the switch contact corresponding to the resistor 28a of the corresponding pulse amplitude modulator 14 is a normally closed contact. The second switching contact of the two-pole switch 43a is in that case a normally closed contact because the switch contact corresponding to the resistor 29a of the corresponding pulse amplitude modulator 14 is a normally open contact.

The logic circuit 24 is shown in FIG. 9 and comprises of at least three resistors 44 to 46, four comparators 47 to 50, eight flipflops 52 to 55 and 58 to 61, one pulse generator 51, four AND gates 56, 57, 62 and 63, two OR gates 64 and 65, one up/down counter 66 and on additional resistor 67. The flipflops in this case are preferably D flipflops.

The three resistors 44, 45 and 45 are connected in series in the order given. A first pole of the series connection 44;45;46 which is a voltage divider is fed from a positive d.c. voltage supply $V_{CC}$ and a second pole from a negative d.c. supply voltage $-V_{CC}$. The common pole of the resistors 44 and 45 at which a d.c. voltage $V+$ appears, is connected to the inverting inputs of the two comparators 47 and 49. The common pole of the resistors 45 and 46 at which a d.c. voltage $V-$ appears is connected to the non-inverting inputs of the comparators 48 and 50. In the logic circuit 24, a first input is connected to the non-inverting input of the comparator 47 and to the inverting input of the comparator 48, while a second input of the logic circuit 24 is connected to the non-inverting input of the comparator 49 and the inverting input of the comparator 50. Each of the outputs of the four comparators 47 to 50 is connected to a D input of one of the four flipflops 52, 53, 54 or 55 each of whose Q outputs is in turn connected to a D input of one of the four flipflops 58, 59, 60 or 61.

The pulse generator preferably comprises a known quartz oscillator which is followed by a known frequency divider and produces four rectangular timing signals CL1, CL2, CL3 and CL4. The timing signal CL1 supplies the timing inputs of the flipflops 52 and 53, the timing signal CL2 the timing inputs of the flipflops 58 and 59, the timing signal CL3 the timing inputs of the flipflops 54 and 55 and the timing signal CL4 the timing inputs of the flipflops 60 and 61. The Q output of the flipflop 53 and the inverted Q output of the flipflop 59 are each connected to one of two inputs of the AND gate 56 whose output is connected to a first control output of the logic circuit 24 and to a first input of the OR gate 65. The Q output of the flipflop 52 and the inverted Q output of the flipflop 58 are each connected to on of two inputs of the AND gate 62 whose output is connected to a second control output of the logic circuit 24 and to a first input of the OR gate 64. The Q output of the flipflop 55 and the inverted Q output of the flipflop 61 are each connected to one of two inputs of the AND gate 57 whose output is connected to a third control output of the logic circuit 24 and to a second input of the OR gate 64. The Q output of the flipflop 54 and the inverted Q output of the flipflop 60 are each connected to one of two inputs of the AND gate 63 whose output is connected to a fourth control output of the logic circuit 24 and to a second input of the OR gate 65. The output of the OR gate 64 is connected to an up counter input and the output of the OR gate 65 to a down counter input of the up/down counter 66 whose output is connected directly to a first signal output and via resistance 67 to a second signal output of the logic circuit 24.

In the logic circuit 24, the two comparators 47 and 48 are associated with its first input and the comparators 49 and 50 with its second input. The flipflops 52 and 58 as well as the AND gate 62 are associated with the comparator 47, the flipflops 53 and 59 as well as the AND gate 56 are associated with the comparator 48, the flipflops 54 and 60 as well as the AND gate 63 are associated with the comparator 49 and the flipflops 55 and 61 as well as the AND gate 57 are associated with the comparator 50. The timing signal CL1 is associated with the flipflops 52 and 53, the timing signal CL2 is associated with the flipflops 58 and 59, the timing signal CL3 is associated with the flipflops 54 and 55 and the timing signal CL4 is associated with the flipflops 60 and 61.

Figure 10:
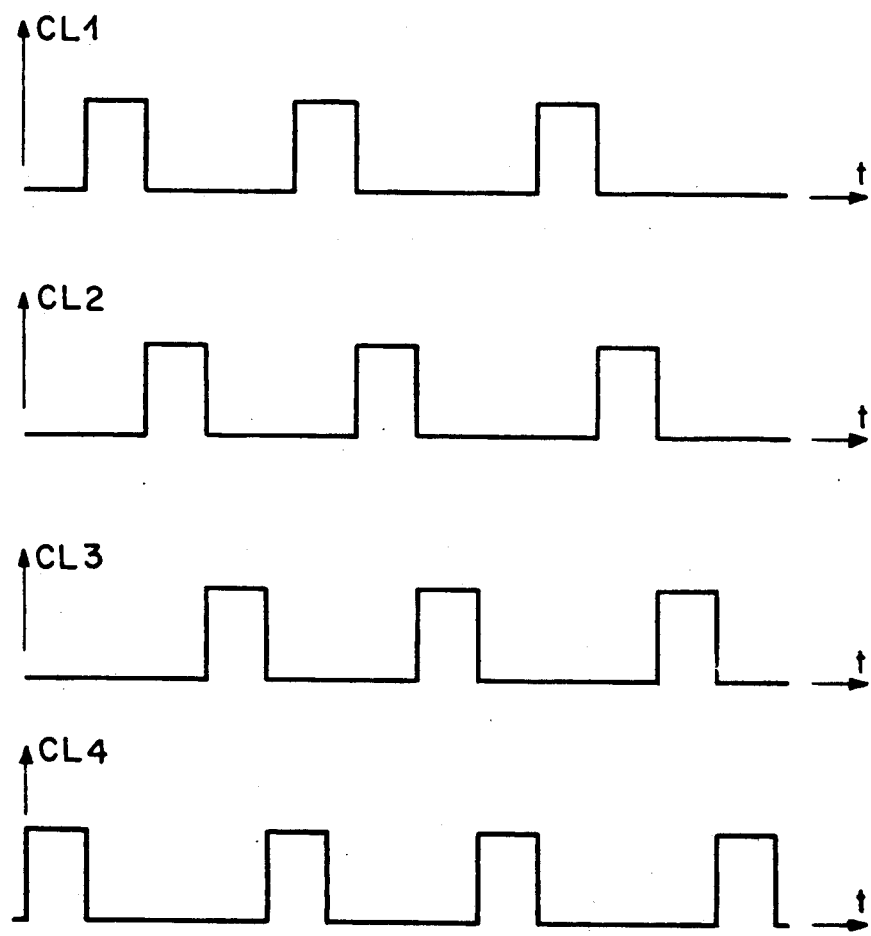
FIG. 10 shows timing signals.

FIG. 10 shows the four timing signals CL1 to CL4, all of which comprise rectangular pulses. The pulses of the timing signal CL2 always start when those of the timing signal CL1 end, the pulses of the timing signal CL3 always start when those of the timing signal CL2 end, the pulses of the timing signal CL4 always start when those of the timing signal CL3 end and the pulses of the timing signal CL1 always start when those of the timing signal CL4 end.

The two comparators 47 and 48 monitor the signal level at the first input of the logic circuit 24 and the comparators 49 and 50 monitor the signal level at the second input of the logic circuit 24 and thereby the comparators 47, 48 and 49, 50 monitor one of the signal levels of one of the two outputs of the arrangement for the integration of marks and spaces. The four comparators 47 to 50 compare every level which they monitor to a voltage window $V+$; $V-$ constituted by the two d.c. voltages $V+$ and $V-$. If the measured integral values appearing at the two inputs of the logic circuit 24 show a voltage within the voltage window $V+$;$V-$, nothing happens. If however these integral values show a voltage outside the voltage window $V+$;$V-$, the output signal of the associated comparator 47, 48, 49 or 50 changes its logic value which is loaded into the associated flipflop 52, 53, 54 or 55 at the next rising edge of the corresponding timing signal CL1 or CL3 and is then transferred with a time delay into the corresponding flipflop 58, 59, 60 or 61 as the edge of the corresponding timing signal CL2 or CL4 rises. Each of the four flipflops 58 to 61 thus contains, delayed in time, the same information as the corresponding flipflop 52, 53, 54 or 55. If one of the flipflops 52, 53, 54 or 53 changes its contents from a logic value "0" to a logic value "1", i.e. if a logic value "1" appears at its Q output when a logic value "1" appears at the inverted Q output of the corresponding flipflop 58, 59, 60 or 61, then a logic value "1" appears at the output of the corresponding AND gate 62, 56, 63 or 57 and is fed via a corresponding control output of the logic circuit 24 to the control input of a switch 21, 21a, 22 or 22a and reverses it, causing the appropriate capacitor 26 or 27 to be discharged (see FIGS. 1, 6, 7 and 8) and is also fed via one of the two OR gates 64 or 65 to the up or to the down counting input of the up/down counter 66, depending on whether there are positive or negative integral values. The discharge of the capacitor 26 or 27 causes the absolute value of the corresponding integral value as well as the absolute value of the signal level at the corresponding input of the logic circuit 24 to be reduced and, as soon as the latter reaches the d.c. voltage $V+$ or $V-$, switches the corresponding comparator 47, 48, 49 or 50 and the corresponding flipflops 52, 53, 54 or 55 back into their original state. As a result of this, the logic values at the outputs of the corresponding AND gate 62, 56, 63 or 57 and of the corresponding OR gate 64 or 65 again assume a logic value of "0". In other words, the output signals of these gates are pulses. The pulses corresponding to a positive value of the integral value are counted up in the up/down counter 66 and those which correspond to a negative integral value are counted down so that the number of pulses at the output of the up/down pulse counter 66 are equal to the algebraic sum of the portions of the integral values which are subtracted from the absolute value of the measured integral value as a result of the capacitors 26 and 27 being discharged. Each pulse at the output of the up/down counter 66 corresponds to a fixed quantum of the measured integral values and thereby of the measured power or energy. The value of the latter is thus equal to the sum of the values of the counted number of pulses and of the values of the portions of measured integral values still stored in the capacitors 26 and 27. The latter values thus represent measuring errors if the counting value of the pulses is taken as a measured value.

The electricity counters according to the invention are suitable to measure signals of great magnitude such as currents in the order of 50 amps.

In short, the present invention is an arrangement to measure an electrical power or energy in a multiphase network. For each phase, the arrangement comprises a transformer 10 supplied with current and a voltage input 18. The transformer 10 is connected via an integrator 11 with a high ohm input to a mark-space-amplitude modulator 13, 14, one of which is provided per phase. Each voltage input is also in communication with the corresponding mark-space-amplitude modulator. Each mark-space-amplitude modulator comprises a mark-space-modulator 13 and a pulse amplitude modulator 14. Each pulse amplitude modulator 14 is provided with two push-pull outputs, each of which is connected to an input of a current/frequency converter for the integrations of marks (pulses) and spaces (i.e. spaces between pulses) present at the output of the pulse amplitude modulator 14. The current/frequency converter is connected to processing and display circuitry for displaying an output.

Finally, the above-described embodiments of the invention are intended to be illustrative only. Numerous alternative embodiments may be devised by those skilled in the art without departing from the spirit and scope of the present invention.

We claim:

1. An arrangement for measuring an electrical power or energy in a network having one or more phases comprising
   a voltage input for each phase,
   a transformer supplied with current for each phase and connected to an integrator with a high ohm input,
   a mark-space-amplitude modulator for each phase and in communication with the corresponding transformer via the corresponding integrator and in communication with the corresponding voltage input for producing marks and spaces whose integration is proportional to a produce of the voltage and current for the phase, each of said mark-space-amplitude modulators comprising a mark-space-modulator and a pulse amplitude modulator having two push-pull outputs,
   a current/frequency converter, an input of said current/frequency converter being connected to each of said push-pull outputs, said current/frequency converter including means for integrating marks and spaces present at the outputs of said pulse amplitude modulator, and
   a processing and display means connected to said current/frequency converter for displaying an output representative of an electrical power or energy.

2. The arrangement as in claim 1, wherein a phase shifter is provided between the integrator with high ohm input and the corresponding mark-space-amplitude modulator.

3. The arrangement as in claim 1, wherein a phase shifter is connected downstream of the voltage input.

4. The arrangement as in claim 2 or 3, wherein the phase shifter comprises a non-inverting amplifier formed using an operational amplifier, and wherein a capacitor is connected in parallel with a resistor in a feedback path of said non-inverting amplifier.

5. The arrangement as in claim 2 or 3, wherein the phase shifter comprises an inverting amplifier formed from an operational amplifier and a capacitor connected in parallel with a resistor in a feedback path of said inverting amplifier between an output and an inverting input of the operational amplifier.

6. The arrangement as in claim 2 or 3, wherein the phase shifter comprises a capacitor which is connected in parallel with a resistor.

7. The arrangement as in one of the claims 1, 2, or 3, wherein the integrator with high ohm input comprises an RC low-pass filter containing a capacitor and at least one resistor.

8. The arrangement as in claim 7, wherein the RC low-pass filter contains two resistors, each one of the two resistors being connected to one output of said transformer.

9. The arrangement as in one of the claims 1, 2, or 3, wherein the transformer has a core with a magnetic discontinuity.

10. The arrangement as in one of the claims 1, 2 or 3, wherein the means for integrating marks and spaces is a differential integrator having first and second inputs connected via first and second resistors to an inverting and a non-inverting input of an operational amplifier, respectively, said operational amplifier having an output which forms a first output of said differential integrator, said non-inverting input of said operational amplifier forming a second output of the differential integrator, whereby a capacitor is installed between the output and the inverting input of the operational amplifier while an additional capacitor is installed between the non-inverting input of the operational amplifier and ground.

11. The arrangement as in one of the claims 1, 2, or 3, wherein the means for integrating the marks and spaces is a differential integrator which comprises first and second resistors for each phase, whereby a first pole of the first resistor of each phase and a first pole of the second resistor of each phase are connected to the outputs of the corresponding pulse amplitude modulator, while a second pole of the first resistor of each phase is connected to an inverting input of an operational amplifier and a second pole of the second resistor of each phase is connected to a non-inverting input of said operational amplifier of said differential integrator, wherein the output of the operational amplifier forms a first output of the differential integrator, wherein a capacitor is located between the output and the inverting input of the operational amplifier and wherein an additional capacitor is located between the non-inverting input of the operational amplifier and ground, and in that the non-inverting input of the operational amplifier is connected via a second amplifier which has an amplification factor of one to an input of the pulse amplitude modulator corresponding to each of said phases and wherein the output of the second amplifier constitutes a second output of the differential integrator.

12. The arrangement as in one of the claims 1, 2, or 3 wherein the means for integrating marks and spaces comprises a first operational amplifier, a second operational amplifier and two capacitors, wherein the outputs of the two operational amplifiers are the outputs of the means for integrating marks and spaces, a pair of resistors for each phase, wherein the first poles of the resistors of each pair are connected to the two outputs of the corresponding pulse amplitude modulator, a second pole of a first resistor of each pair is connected to an inverting input of the first operational amplifier and a second pole of a second resistor of each pair is connected to an inverting input of the second operational amplifier, and wherein one of the two capacitors is installed between the output and the inverting input of each of the two operational amplifiers, while the non-inverting inputs of the two operational amplifiers are grounded.

13. The arrangement of claims 1, 2, or 3 wherein the means for integrating marks and spaces comprises a first capacitor and a second capacitor whose first poles are both grounded and whose second poles are the outputs of the means for integrating marks and spaces, and a pair of resistors and two switching contacts for each phase, wherein the first poles of the resistors of each pair are connected to the two outputs of the pulse amplitude modulator of the corresponding phase while a second pole of a first resistor of each pair is connected via a first one of the two corresponding switching contacts to a second pole of the first capacitor and a second pole of a second resistor of each pair is connected via a second one of the two corresponding switching contacts to a second pole of the second capacitor.

14. The arrangement as in claim 1 wherein an RC network is connected between the voltage input of each phase and each of the two outputs of the corresponding pulse amplitude modulator.

15. The arrangement as in clam 14, wherein the RC network comprises a first resistor, a first capacitor, a second resistor and a second capacitor, wherein an input of the RC network is formed by interconnected first poles of the two resistors, wherein the first poles of the two capacitors are grounded, wherein the second pole of the first resistor and the second pole of the first capacitor are connected to each other and form a first output of the RC network, and wherein the second pole of the second resistor and the second pole of the second capacitor are connected to each other and form a second output of the RC network.

* * * * *